(12) United States Patent  
Nakamura

(10) Patent No.: US 7,573,302 B2
(45) Date of Patent: Aug. 11, 2009

(54) DIFFERENTIAL SIGNAL COMPARATOR

(75) Inventor: Hiroyuki Nakamura, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 16 days.

(21) Appl. No.: 11/961,682

(22) Filed: Dec. 20, 2007

(65) Prior Publication Data

US 2008/0180173 A1 Jul. 31, 2008

(30) Foreign Application Priority Data

Jan. 31, 2007 (JP) ............... 2007-021439

(51) Int. Cl.
*H03K 5/153* (2006.01)
(52) U.S. Cl. ............... 327/89; 327/66; 327/67; 327/359
(58) Field of Classification Search ............. None
See application file for complete search history.

(56) References Cited

U.S. PATENT DOCUMENTS

| | | | |
|---|---|---|---|
| 5,006,732 A | 4/1991 | Nakamura | |
| 6,670,773 B2 | 12/2003 | Nakamura et al. | |
| 6,777,984 B2 * | 8/2004 | Hangaishi | 327/66 |
| 6,870,553 B2 | 3/2005 | Kondo et al. | |
| 6,992,663 B2 | 1/2006 | Nakamura et al. | |
| 7,248,115 B2 * | 7/2007 | Nishimura | 330/253 |

2006/0103433 A1  5/2006  Nishimura

FOREIGN PATENT DOCUMENTS

JP  2006-148364 A  6/2006

OTHER PUBLICATIONS

U.S. Appl. No. 11/961,733, filed Dec. 20, 2007, Applicant: Hiroyuki Nakamura.

* cited by examiner

*Primary Examiner*—An T Luu
(74) *Attorney, Agent, or Firm*—Fitzpatrick, Cella, Harper & Scinto

(57) ABSTRACT

There is provided a differential signal comparator which maintains the duty ratio of complementary input signals. The differential signal comparator includes differential amplifier circuits 1 and 2 receiving complementary input signals, a plurality of current amplifier circuits 3 to 6 for amplifying current output from the differential amplifier circuits and a current arithmetic operation circuit 7 for an arithmetic operation of an output from the plurality of current amplifier circuits 3 to 6 at the time of converting the differential signal between the complementary input signals into a voltage of CMOS level, wherein a capacitive load of an output of the differential amplifier circuit is constant independent of a level of the input signals. A voltage signal which is current-voltage converted to a complementary CMOS level signal is input into a differential comparator to obtain a single end CMOS level signal.

4 Claims, 5 Drawing Sheets

DIFFERENTIAL SIGNAL COMPARATOR

BACKGROUND OF THE INVENTION

1. Field of the Invention

The present invention relates to a differential signal comparator which handles a differential signal.

2. Description of the Related Art

A high-speed differential interface circuit is used according as signals have been increased in speed in recent years, typified by a reduced swing differential signaling (RSDS) or a low voltage differential signaling (LVDS).

In these circuits, a differential signal is used as an input signal, so that a voltage comparator circuit with a differential input is used in the receiver circuits. The input differential voltage requires a differential signal component of ±50 mV and common mode signal component of so-called rail-to-rail (power supply to GND).

The differential signal comparator which handles such a differential signal is an application of a differential amplifier. A circuit, as an example of a differential amplifier circuit, is disclosed in Japanese Patent Application Laid-Open No. 2006-148364. FIG. 5 illustrates the differential amplifier circuit in the application. The figure includes input differential pairs DF61 and DF62, current mirrors CM61 to CM64 and constant currents I61 and I62.

In the circuit structure illustrated in FIG. 5, when the input signal is in the vicinity of rail-to-rail, for example, in the vicinity of GND, only the input differential pair DF61 operates. For this reason, if the input voltage is:

(1) In$^+$>In$^-$ and
(2) In$^+$<In$^-$, with the same constant current I61, in the above case (1), the current mirror CM61 with the ratio of 1:1 is driven, and in the above case (2), the current mirror CM62 with the ratio of 1:k is driven. For this reason, there exists difference in a load between the cases (1) and (2), that is to say, difference in the node parasitic capacitances across the gate portions of the current mirrors CM61 and CM62. The difference in the load makes the response of the current mirror asymmetric, creating a problem in that the current mirror generates a voltage comparison output whose duty ratio is different from the duty ratio of the input signal.

SUMMARY OF THE INVENTION

The object of the present invention is to provide a differential signal comparator which maintains the duty ratio of a complementary input signal.

A differential signal comparator according to the present invention is characterized by including a differential amplifier circuit receiving complementary input signals and a plurality of current amplifier circuits for amplifying current output from the differential amplifier circuit, so as to convert the differential signal between the complementary input signals into a voltage of CMOS level, wherein the differential signal comparator further includes a current arithmetic operation circuit for an arithmetic operation of an output from the plurality of current amplifier circuits, and a capacitive load of an output of the differential amplifier circuit is constant independent of a level of the input signals. In the present invention, a voltage signal which is current-voltage converted to a complementary CMOS level signal is input into a differential comparator to provide a single end CMOS level signal.

According to the present invention, it is enable to obtain a CMOS level output which suppresses the impairment of a duty ratio for a rail-to-rail common mode input signal and a small-amplitude differential input.

Further features of the present invention will become apparent from the following description of exemplary embodiments with reference to the attached drawings.

DESCRIPTION OF THE EMBODIMENTS

Figure 1:
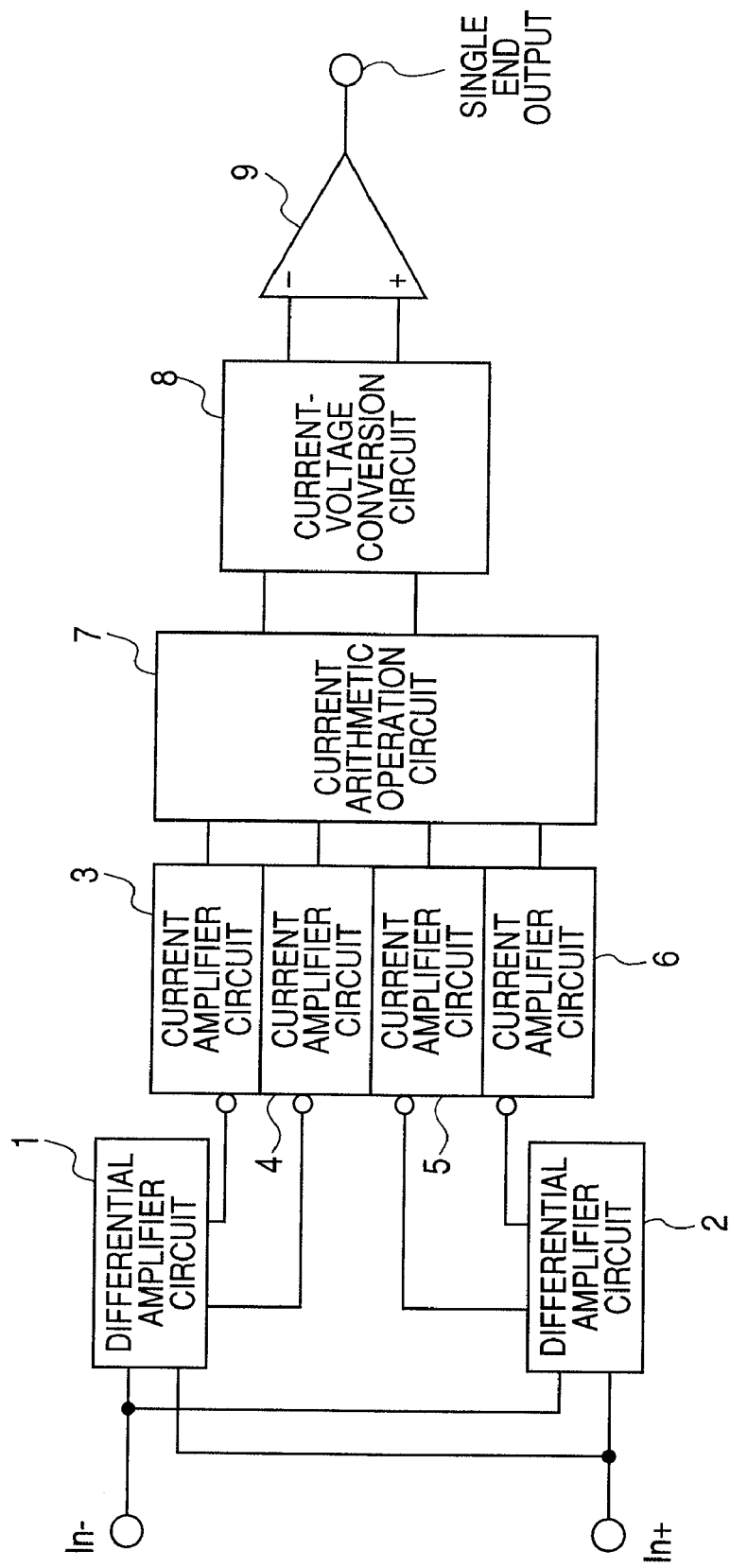
FIG. 1 is a schematic diagram of the differential signal comparator of the present invention.

An exemplary embodiment for carrying out the invention is described in detail with reference to the drawings. FIG. 1 illustrates a schematic diagram of the differential signal comparator according to the present invention. In the figure, the differential signal comparator includes a first differential amplifier circuit 1 and a second differential amplifier circuit 2. Differential signals are input into input terminals In$^-$ and In$^+$ of the first and the second complementary differential amplifier circuit 1 and 2. A common mode voltage input into input terminals In$^-$ and In$^+$ is set within the range of from 0 V to the power supply voltage and the differential voltage to be applied is within the range of from 0.1 V to 3 V.

The output current of the first differential amplifier circuit 1 is input into two current amplifier circuits 3 and 4 which have the same load capacitance. The output current of the second differential amplifier circuit 2 is input into two current amplifier circuits 5 and 6 which have the same load capacitance.

The output current of the current amplifier circuits 3 to 6 is processed in a current arithmetic operation circuit 7 to deliver a complementary current output. In addition, the current output is converted to a voltage output by a current-voltage conversion circuit 8 and then input into a differential comparator 9 to be converted to a single end CMOS level signal. Incidentally, the term "CMOS level" represents a voltage level within the range of from GND to the power supply voltage.

Figure 2:
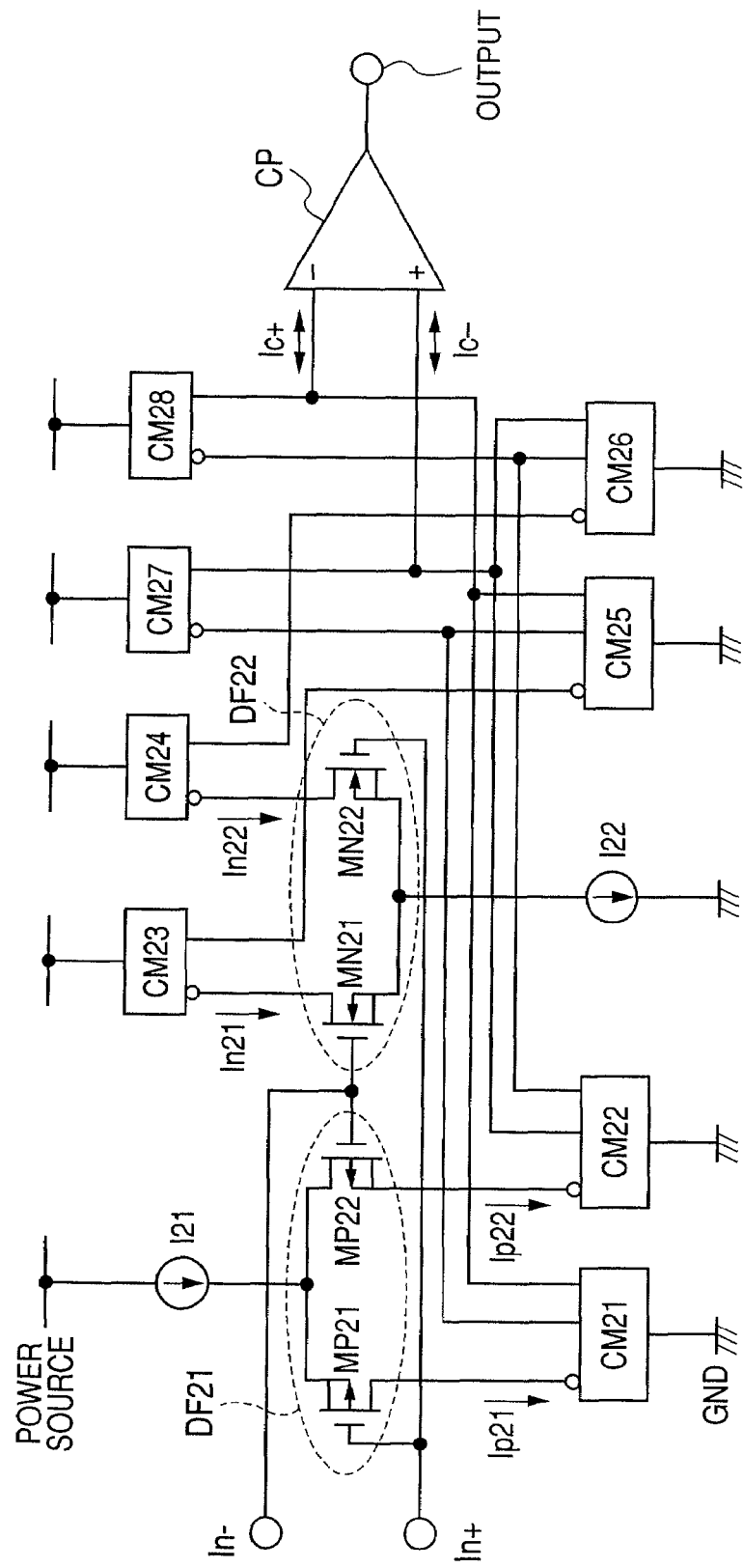
FIG. 2 is a circuit diagram illustrating one embodiment of the differential signal comparator of the present invention.

FIG. 2 is a circuit diagram illustrating a concrete example of the differential signal comparator in FIG. 1. The differential signal comparator according to the present embodiment includes a first differential pair DF21 with PMOS transistors MP21 and MP22 and a second differential pair DF22 with NMOS transistors MN21 and MN22. The first differential pair DF21 corresponds to the first differential amplifier circuit 1 in FIG. 1 and the second differential pair DF22 corresponds to the second differential amplifier circuit 2.

The differential signal comparator further includes first, second, third and fourth current mirror circuits CM21, CM22, CM23 and CM24. The first current mirror circuit CM21 corresponds to the current amplifier circuit 3 in FIG. 1 and the current mirror circuit CM22 corresponds to the current amplifier circuit 4. The current mirror circuit CM23 corresponds to the current amplifier circuit 5 and the current mirror circuit CM24 corresponds to the current amplifier circuit 6.

The differential signal comparator still further includes fifth, sixth, seventh and eighth current mirror circuits CM25, CM26, CM27 and CM28. The fifth and the sixth current mirror circuit CM25 and CM26 correspond to the current arithmetic operation circuit 7 in FIG. 1. The seventh and the eighth current mirror circuit CM27 and CM28 correspond to the current-voltage conversion circuit 8 in FIG. 1.

The differential signal comparator is provided with constant current sources 121 and 122 and a differential comparator CP. The differential comparator CP corresponds to the differential comparator 9 in FIG. 1. The current mirror circuits CM21, CM22, CM25 and CM26 each have two output terminals.

The input terminal of the first current mirror circuit CM21 is connected to the drain of the PMOS transistor MP21 of the first differential pair DF21 and the common source electrode thereof is connected to GND. A first output terminal out of the two output terminals of the first current mirror circuit CM21 is connected to the input terminal of the current mirror circuit CM27 along with the first output terminal of the current mirror circuit CM25. The other second output terminal is connected to the second output terminal of the current mirror circuit CM25 and the output terminal of the current mirror circuit CM28 and forms a first output ($Ic^+$) which is a non-inversion input of the comparator CP.

The input terminal of the second current mirror circuit CM22 is connected to the drain of the PMOS transistor MP22 of the first differential pair DF21 and the common source electrode thereof is connected to GND. A first output terminal out of the two output terminals of the second current mirror circuit CM22 is connected to the input terminal of the current mirror circuit CM28 along with the second output terminal of the current mirror circuit CM26. The other second output terminal is connected to the first output terminal of the current mirror circuit CM26 and the output terminal of the current mirror circuit CM27 and forms a second output ($Ic^-$) which is an inversion input of the comparator CP.

The input terminal of the third current mirror circuit CM23 is connected to the drain of the NMOS transistor MN21 of the second differential pair DF22 and the common source electrode thereof is connected to the power supply. The output terminal of the third current mirror circuit CM23 is connected to the input terminal of the current mirror circuit CM25.

The input terminal of the fourth current mirror circuit CM24 is connected to the drain of the NMOS transistor MN22 of the second differential pair DF22 and the common source electrode thereof is connected to the power supply. The output terminal of the fourth current mirror circuit CM24 is connected to the input terminal of the current mirror circuit CM26.

The current mirror ratio of the first current mirror circuit CM21 to the second current mirror circuit CM22 is 1:k, and the current mirror ratio of the third current mirror circuit CM23 to the fourth current mirror circuit CM24 is 1:m. The current mirror ratio of the fifth current mirror circuit CM25 to the sixth current mirror circuit CM26 is 1:n and the current mirror ratio of the seventh current mirror circuit CM27 to the eighth current mirror circuit CM28 is 1:1. The relationship among k, m and n is represented by $k=m \times n$.

The constant current source 121 is connected between the sources of the PMOS transistors MP21 and MP22 of the first differential pair DF21 which are commonly connected together and the power supply. The constant current source 122 is connected between the sources of the NMOS transistors MN21 and MN22 of the second differential pair DF22 which are commonly connected together and GND.

In the differential signal comparator, the gate of the PMOS transistor MP21 is connected to the gate of the NMOS transistor MN22, which is taken to be a non-inversion input terminal $In^+$. In addition, the gate of the PMOS transistor MP22 is connected to the gate of the NMOS transistor MN21, which is taken to be an inversion input terminal $In^-$. Thus, the input differential pair is formed by combining the N-channel MOS differential pair with the P-channel MOS differential pair, enabling substantial GND level to power supply voltage to be input.

The present invention is an application of a differential amplifier having rail-to-rail input capability. In general, a differential amplifier having rail-to-rail input capability includes three modes according to input signals. The first mode is a domain where the common mode electric potential of an input signal is too low to obtain a drain electric potential which the constant current source 122 requires for its operation and only the first differential pair DF21 operates.

The second mode is a domain where both constant current sources 121 and 122 can operate and both first and second differential pairs DF21 and DF22 operate. The third mode is a domain where the common mode electric potential of an input signal is too high to obtain a drain electric potential which the constant current source 122 requires for its operation and only the second differential pair DF22 operates.

The operation of the present embodiment is described below. The drain current of the PMOS transistor MP21 is taken to be Ip21 and the drain current of the PMOS transistor MP22 is taken to be Ip22, and if the drain current of the NMOS transistor MN21 is taken to be In21 and the drain current of the NMOS transistor MN22 is taken to be In22, the input and the output current of each current mirror circuit are given below. The current mirror circuits CM21, CM22, CM25 and CM 26 each have two output terminals and the output current given below represents each current of the two output terminals.

The input current of CM21; Iin21=Ip21
The output current of CM21; Iout21=k×Iin21=K×Ip21
The input current of CM22; Iin22=Ip22
The output current of CM22; Iout22=k×Iin22=K×Ip22
The input current of CM23; Iin23=In21
The output current of CM23; Iout23=m×Iin23=m×In21
The input current of CM24; Iin24=In22
The output current of CM24; Iout24=m×Iin22=m×In22
The input current of CM25; Iin25=Iout23=m×In21
The output current of CM25; Iout25=m×n×Iin22=k×In21
The input current of CM26; Iin26=Iout24=m×In22
The output current of CM26; Iout26=m×n×Iin22=k×In22
The input current of CM27; Iin27=k×Ip21+m×n×In21=k×(Ip21+In21)
The output current of CM27; Iout27=k×(Ip21+In21)
The input current of CM28; Iin28=k×Ip22+m×n×In22=k×(Ip22+In22)
The output current of CM28; Iout28=k×(Ip22+In22), therefore, the non-inversion input current $Ic^+$ of the differential comparator can be given by the following equation:

$$Ic^+=k \times (Ip21+In21)-(Iout22+Iout26)=k \times \{(Ip21+In21)-(Ip22+In22)\}.$$

The inversion input current $Ic^-$ of the differential comparator can be given by the following equation:

$$Ic^-=k \times (Ip22+In22)-(Iout22+Iout25)=k \times \{(Ip22+In22)-(Ip21+In21)\}.$$

The above equation is used to calculate current in the second mode, but it is also effective for the other two modes. That is to say, settings may be performed as follows:
in the first mode, In21=In22=0, and
in the third mode, Ip21=Ip22=0.

The currents Ic⁺ and Ic⁻ charge and discharge parasitic capacity existing in the input node of the comparator, however the current mirror circuit outputs a high-impedance constant current and its electric potential will be a level in the vicinity of from the power supply to GND according to the direction of the output current. In addition, as can be seen from the above current equations of Ic⁻ and Ic⁺, they are complementary output of current and converted into a complementary voltage signal substantially equal to CMOS level.

The complementary voltage signal is input into the differential comparator to deliver a CMOS single end output faithful to the duty ratio of the input signal.

Figure 3A:
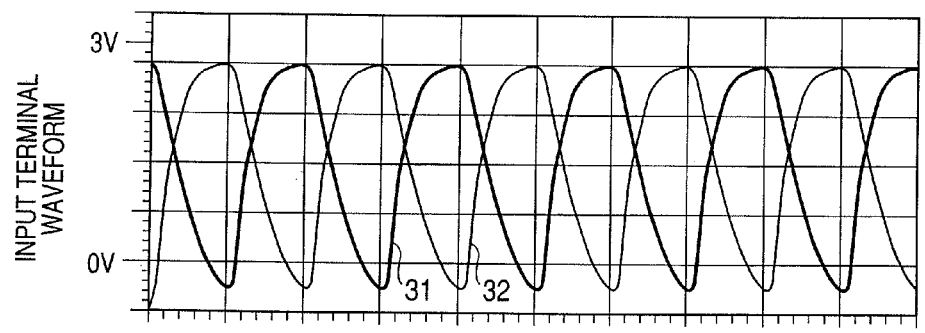
FIGS. 3A and 3B are graphs illustrating simulation results on the present invention.
Figure 3B:
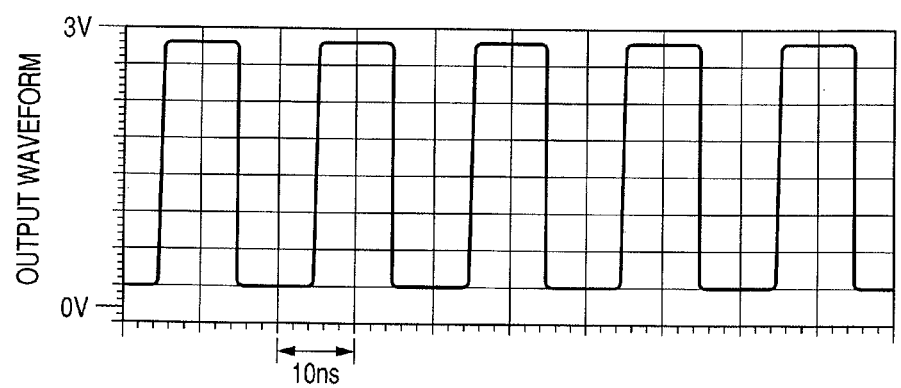

FIGS. 3A and 3B are graphs illustrating the input and output waveform. FIG. 3A illustrates complementary signals input into the differential comparator. FIG. 3B illustrates the waveform output from the differential comparator. Combining the voltage waveform 31 with the complementary voltage waveform 32 in FIG. 3A to provide an output which is a highly accurate duty ratio with respect to the input signal as shown in FIG. 3B. The voltage waveform 31 in FIG. 3A is a non-inversion waveform input into the differential comparator CP. The voltage waveform 32 is an inversion input waveform.

Figure 4:
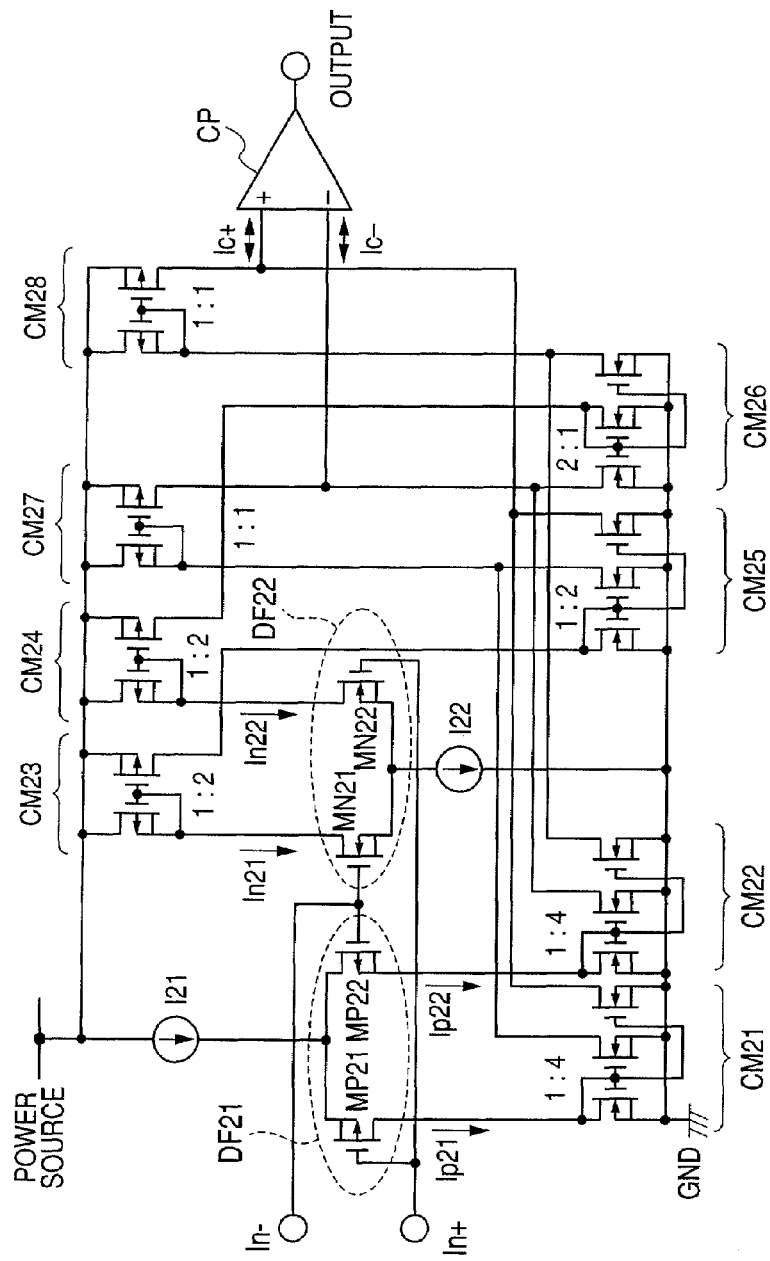
FIG. 4 is a circuit diagram illustrating further in detail the circuit in FIG. 2.
Figure 5:
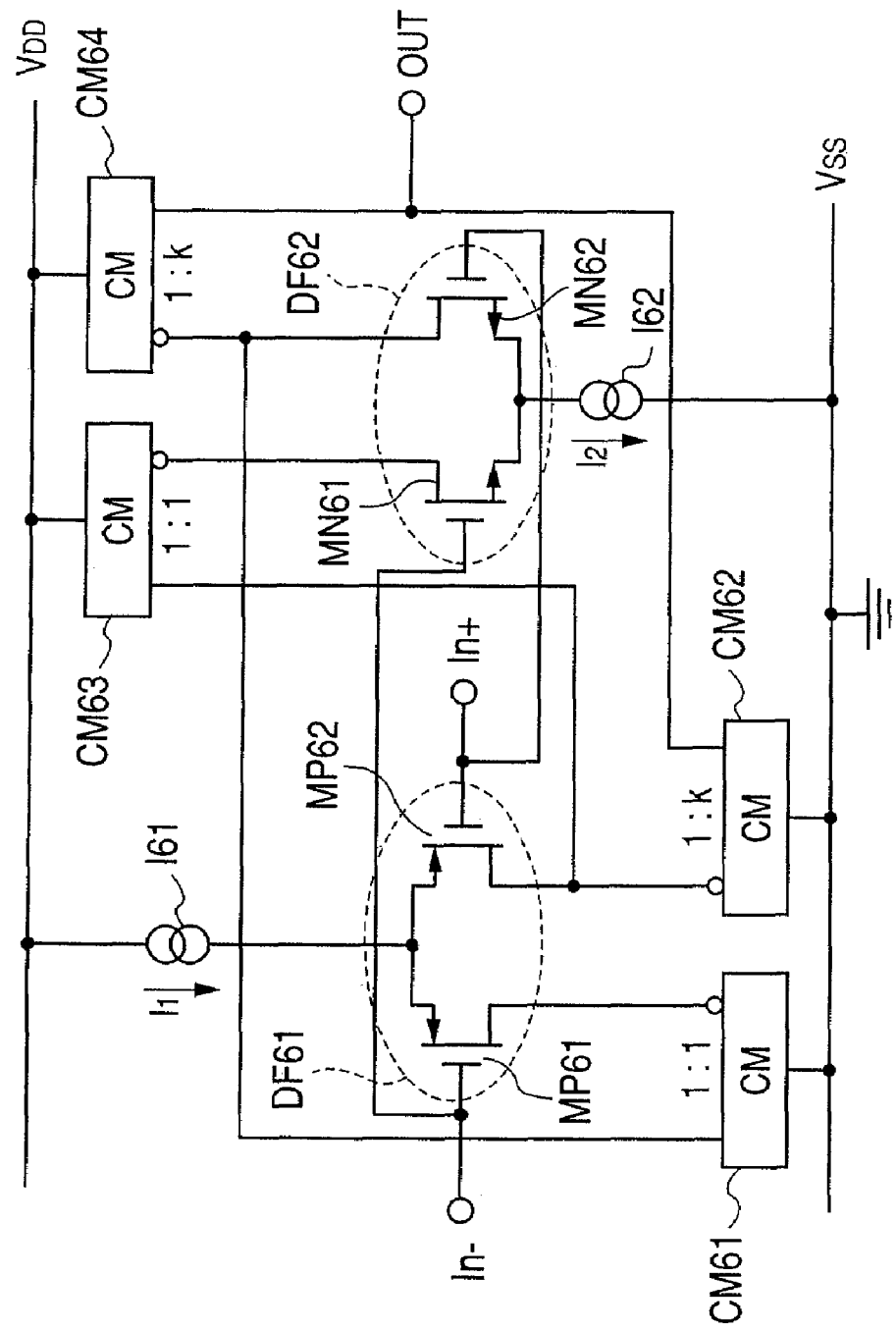
FIG. 5 is a circuit diagram illustrating a conventional differential signal comparator.

FIG. 4 is a further detailed diagram of the circuit illustrated in FIG. 2 and concretely illustrates each current mirror circuit. FIG. 4 shows the current mirror ratio of each current mirror circuit described above. In this example, the current mirror ratio of the first and the second current mirror circuit CM21 and CM22 is taken to be 1:4, that of the third and the fourth current mirror circuit CM23 and CM24 is taken to be 1:2. In addition, the current mirror ratio of the fifth and the sixth current mirror circuit CM25 and CM26 is taken to be 2:1 and that of the seventh and the eighth current mirror circuit CM27 and CM28 is taken to be 1:1.

Although the differential signal comparator in the above embodiment is configured by using MOS transistors, the comparator may be configured by using bipolar transistors in the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-021439, filed Jan. 31, 2007, which is hereby incorporated by reference herein in its entirety.

What is claimed is:

1. A differential signal comparator for converting difference voltage between complementary input signals into a voltage of CMOS level, wherein the complementary input signals are input into first and second differential amplifier circuits complementary to each other, the first differential amplifier circuit outputs first and second currents, the second differential amplifier circuit outputs third and fourth currents, the first and second currents are output into first and second current amplification circuits, the third and fourth currents are output into third and fourth current amplification circuits, outputs from the first to fourth current amplification circuits are input into a current arithmetic operation circuit, the current arithmetic operation circuit outputs complementary current based on the complementary input signals, the complementary current output is current-voltage converted, and the converted signal is input into a differential comparator of CMOS level input, and further converted into a single end CMOS level output.

2. The differential signal comparator according to claim 1, further comprising:
a first current mirror circuit for outputting two series of currents being k times as large as the first current based on the first current,
a second current mirror circuit for outputting two series of currents being k times as large as the second current based on the second current,
a third current mirror circuit for outputting a current being m times as large as the third current based on the third current,
a fourth current mirror circuit for outputting a current being m times as large as the fourth current based on the fourth current,
a fifth current mirror circuit for outputting two series of currents being n times as large as an output current from the third current mirror circuit based on the output current from the third current mirror circuit,
a sixth current mirror circuit for outputting two series of currents being n times as large as an output current from the fourth current mirror circuit based on the output current from the fourth current mirror circuit,
a seventh current mirror circuit for inputting output currents from the first and fifth current mirror circuits and for outputting a current based on the output currents from the first and fifth current mirror circuits, and
an eighth current mirror circuit for inputting output currents from the second and sixth current mirror circuits and for outputting a current based on the output currents from the second and sixth current mirror circuits, wherein
a first differential current is produced by combining the output currents from the first, fifth and seventh current mirror circuits,
a second differential current complementary to the first differential current is produced by combining the output currents from the second, sixth and eighth current mirror circuits, and
the differential comparator inputs the first and second differential currents and convert them into the single end CMOS level output.

3. The differential signal comparator according to claim 2, wherein k, m and n meet relation: k=m×n.

4. The differential signal comparator according to claim 1, wherein
the first differential amplifier circuit has first and second PMOS transistors, and a first constant current source connected to a node to which sources of the first and second PMOS transistors are connected commonly,
the second differential amplifier circuit has first and second NMOS transistors, and a second constant current source connected to a node to which sources of the first and second NMOS transistors are connected commonly,
a drain of the first PMOS transistor is connected to an input of the first current mirror circuit, a drain of the second PMOS transistor is connected to an input of the second current mirror circuit,
a drain of the first NMOS transistor is connected to an input of the third current mirror circuit, a drain of the second NMOS transistor is connected to an input of the fourth current mirror circuit,
gates of the first PMOS transistor and the first NMOS transistor are commonly connected, and connected to one of the input terminals, and
gates of the first NMOS transistor and the second NMOS transistor are commonly connected, and connected to the other of the input terminals.

* * * * *